United States Patent
Oh et al.

(10) Patent No.: US 6,773,929 B2
(45) Date of Patent: Aug. 10, 2004

(54) FERROELECTRIC MEMORY DEVICE AND METHOD FOR MANUFACTURING THE SAME

(75) Inventors: Sang-Hyun Oh, Ichon-shi (KR); Chung-Won Suh, Ichon-shi (KR); Jin-Yong Seong, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/242,417

(22) Filed: Sep. 13, 2002

(65) Prior Publication Data

US 2003/0053351 A1 Mar. 20, 2003

(30) Foreign Application Priority Data

Sep. 14, 2001 (KR) .......................................... 2001-56829
Dec. 31, 2001 (KR) .......................................... 2001-88713

(51) Int. Cl.[7] ............................................. H01L 21/00
(52) U.S. Cl. .............................. 438/3; 438/240; 257/68; 257/71; 257/295; 257/298; 257/300; 257/324
(58) Field of Search .................... 438/3, 240; 257/68, 257/71, 295–314, 324–326

(56) References Cited

U.S. PATENT DOCUMENTS 5,994,153 A 11/1999 Nagel et al.

| 6,046,469 A | 4/2000 | Yamazaki et al. |
| 6,090,657 A | 7/2000 | Yamoto et al. |
| 6,458,604 B1 * | 10/2002 | Yang ............................. 438/3 |
| 6,521,929 B2 * | 2/2003 | Ozaki .......................... 257/295 |

FOREIGN PATENT DOCUMENTS

| JP | 11-274406 A | 10/1999 |
| JP | 2001-007304 A | 1/2001 |
| KR | 1999-013932 A | 2/1999 |
| KR | 2001-0004364 A | 1/2001 |

* cited by examiner

Primary Examiner—David Nelms
Assistant Examiner—Andy Huynh
(74) Attorney, Agent, or Firm—Birch, Stewart, Kolasch & Birch LLP

(57) ABSTRACT

The present invention provides a ferroelectric memory device and a manufacturing method forming the same capable of preventing characteristic deterioration of a ferroelectric layer due to an plasma. The ferroelectric memory device divided into a first area including a plurality of ferroelectric capacitor and a second area not including the ferroelectric capacitor, includes a semiconductor substrate; a first insulating layer formed on the semiconductor substrate; and a bottom electrode of the ferroelectric capacitor formed in the first insulating layer, wherein a top surface of the bottom electrode is planarized with the first insulating layer; a ferroelectric layer of the ferroelectric capacitor covering not only the bottom electrode but also all the first area; and a top electrode of the ferroelectric capacitor formed on the ferroelectric layer and overlapped with the bottom electrode.

10 Claims, 14 Drawing Sheets

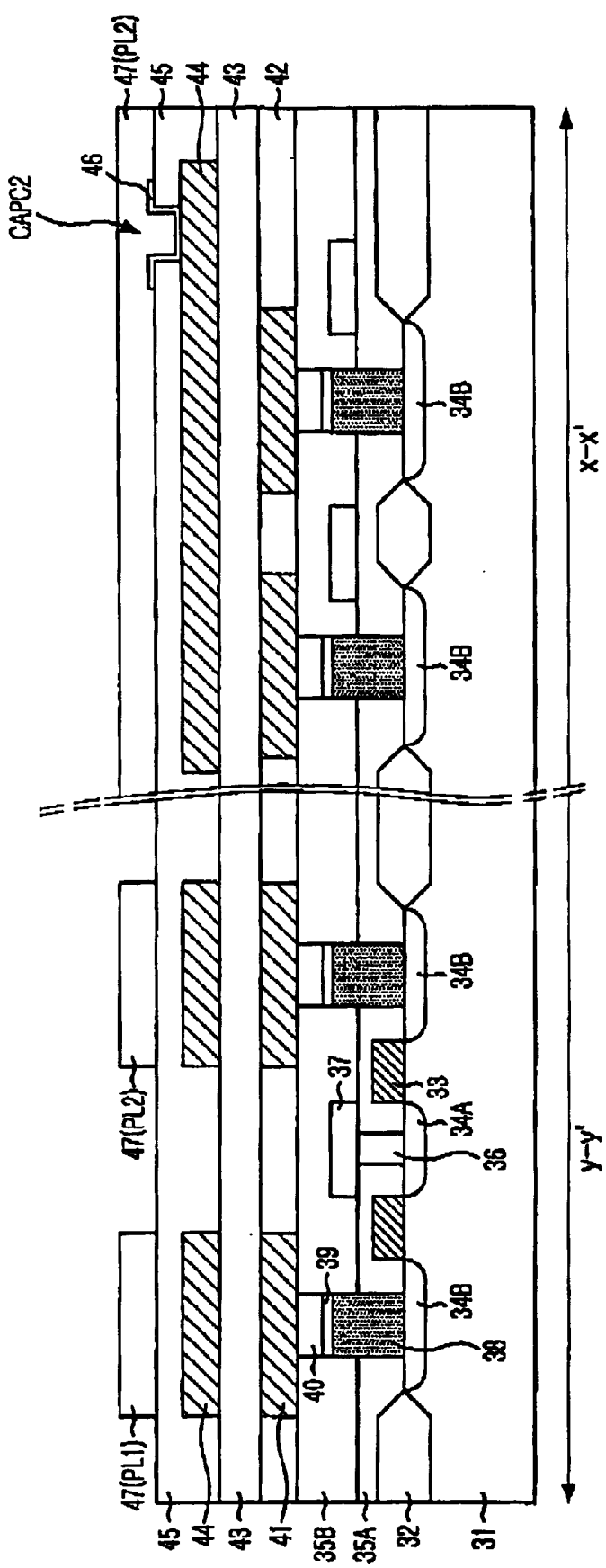

FERROELECTRIC MEMORY DEVICE AND METHOD FOR MANUFACTURING THE SAME

FIELD OF THE INVENTION

The present invention relates to a ferroelectric memory device; and, more particularly, to a ferroelectric memory device including a ferroelectric layer covering all cell region and a method for manufacturing the same.

DESCRIPTION OF RELATED ART

Several studies on utility of a ferroelectric material as a capacitor dielectric, have been developed to overcome a limit of refresh in a conventional dynamic random access memory(DRAM) and to achieve a large capacitance. A ferroelectric random access memory (FORAM) is one of e nonvolatile memory devices that can store information at turn-off state and has a rapid operating speed comparable to that of the DRAM.$SrBi_2Ta_2O_9$ (SBT), $Pb(Zr_x, Ti_{1-x})O_3$ (PZT) or $(Bi,La)_4Ti_3O_{12}$ (BLT)is mainly used as a storage material of FeRAM. The ferroelectric material has a dielectric constant being in the order of $10^2$–$10^3$ at room temperature and has two stabilized remnant polarization states. Therefore, the ferroelectric material is suitable for applying to a nonvolatile memory device.

A signal is inputted to the nonvolatile memory device adopting ferroelectric material by the change of polarization orientation according to an electric field applied thereto, and a digital signal "1" or "0" is stored therein by an orientation of remnant polarization when an electric field is removed.

In a FeRAM device adopting $Sr_xBi_y(Ta_iNb_j)_2O_9$ (hereinafter, referred to as a SBTN), etc, which have perovskite structure, as a ferroelectric layer in a ferroelectric capacitor besides the above-mentioned PZT and SBT, a top/bottom electrode is formed of any one selected from the group consisting of Pt, Ir, Ru, IrO, RuO and Pt-alloy.

FIG. 1 is a conventional equivalent circuit illustrating a FeRAM having one transistor and one capacitor(1T-1C) structure. In FIG. 1, 'C' denotes a ferroelectric capacitors, 'Q' denotes a MOS transistor, '$WL_1$ and $WL_2$' denote word lines connected to a gate of the MOS transistor Q, 'BL' denotes a bit line connected to a source/drain region of the MOS transistor, and 'PL' denotes a plate line connected to a top electrode of the terroelectric capacitor C.

FIG. 2 is a cross-sectional view of the FeRAM shown in FIG. 1.

Referring to FIG. 2, adjacent two transistors are formed on a semiconductor substrate 11. A field oxide layer 12 is formed in a predetermined portion of the semiconductor substrate 11 in order to separate two transistors from another two transistors(not shown).

The transistor is formed according to a usual complementary metal oxide semiconductor (CMOS) process. A gate electrode 13 is formed on the semiconductor substrate 11, and a common connection drain of adjacent two transistors (hereinafter, referred to as a 'common drain') 14A and source 14B of each transistor are formed in the semiconductor substrate at each side of the gate electrode 13.

A first interlayer insulating layer 15 is formed and flattened on the semiconductor substrate 11. The first interlayer insulating layer 15 is formed of a first and a second insulating layer 15A and 15B successively deposited. A bit line 17 is connected to the common drain 14A through a fist contact plug 16 penetrating the first insulating layer 15A, and the bit line 17 is insulated by the second insulating layer 15B.

A second contact plug 18 penetrates the first interlayer insulating layer 15 and is connected the source 143 of each transistor and a bottom electrode 19 of a ferroelectric capacitor.

A bottom electrode 19 and a ferroelectric layer 20 are formed on the first interlayer insulating layer 15 to the same size, and a top electric 21 having smaller size than that of the bottom electrode 19 is formed on the ferroelectric layer 20.

A second interlayer insulating layer 22 covers the ferroelectric capacitor and has opening which exposes the top electrode 21. A plate line 23 is formed to couple to the top electrode through the opening in the second interlayer insulating layer 22.

The conventional ferroelectric capacitor of FeRAM cell shown in FIG. 2 is formed by stacking layers for the bottom electrode 19, the ferroelectric layer 20 and the top electrode 21, successively. Thereafter, the top electrode 21 is etched, and the ferroelectric layer 20 and the bottom electrode 19 are etched using other mask different from a mask for forming the top electrode 21.

In the conventional method, it is difficult to form the top electrode and the bottom electrode to the same size, if the size of a bottom and top electrode is same, a bottom and top electrode can be shorten, so it is hard to obtain safety in a process. Also, it is difficult to form the ferroelectric capacitor with one step etch process because the layers of the ferroelectric capacitor is thick. Furthermore, the etch profile of the ferroelectric capacitor is not vertical but is slant, so there is some limit to reduce the size of the ferroelectric capacitor.

Due to the above-mentioned reason, the size of a top electrode, which determines an electric charge storage capacity of a capacitor, is restricted to be smaller than that of a bottom electrode so that is difficult to obtain enough amount of an electric charge.

In the conventional method, the ferroelectric layer is formed to cover the bottom electrode layer just after forming the bottom electrode layer, so the ferroelectric layer should be etched in an etch process for forming the bottom electrode pattern. In the etch process, the ferroelectric layer is exposed to plasma, and thereby the characteristics of the ferroelectric layer is deteriorated. Therefore, a thermal treatment to recover characteristic of the ferroelectric layer should be performed.

That is, when an etch process for forming the bottom electrode is performed, the portion of ferroelectric layer not covered with the top electrode is inevitably exposed to plasma. At this circumstance of the ferroelectric layer being exposed to plasma, polarization has not have a value of (+) and (−), and according to a condition of the ferroelectric layer being exposed to plasma, a value is fixed into (+) or (−), namely pinning phenomenon is generated. Accordingly, a capacity of the ferroelectric capacitor is reduced extremely.

To solve the above-mentioned problem of the ferroelectric layer being exposed to plasma, the ferroelectric layer is formed on the bottom electrode by a spin coating or liquid source misted chemical deposition (LSMCD) after patterning the bottom electrode.

However, it is difficult to form the ferroelectric layer to a uniform thickness because of a bottom electrode and a topology of sub-layers, which are formed before the bottom electrode. Furthermore, cracks can be generated in a portion of the ferroelectric layer where the bottom electrode is not exist, so it is hard to adopt the spin coating and LSMCD to formed the ferroelectric layer.

In addition, the height of the ferroelectric capacitor formed of the bottom electrode, the ferroelectric layer and the top electrode is over 5500 Å. Therefore, burden of etching is increased, and it becomes more difficult to fill an insulating layer between capacitors and to flat the insulating layers as the cell area is decreased.

With decreasing a cell area, it is hard to form a contact hole between the plate line and the capacitor. There, there is proposed a method of connecting the top electrode directly to the plate line by removing an interlayer insulating layer, which covers the top electrode, with a blanket etching or a chemical mechanical polishing (CMP). However from the above-mentioned method, there may be brought out a problem that a plate line and a bottom electrode are being shorten when the interlayer insulating layer is very thin.

SUMMARY OF THE INVENTION

It is, therefore, an object of the present invention to provide a ferroelectric memory device and manufacturing method forming the same capable of preventing characteristic deterioration of a ferroelectric layer due to an plasma.

It is, therefore, another object of the present invention to provide a ferroelectric memory device and manufacturing method forming the same capable of preventing decreasing of an electric charge storage capacity according to a limit of an electrode size.

It is, therefore, further another object of the present invention to provide a manufacturing method of a ferroelectric memory device capable of preventing burden of a etching process cause by the height of a capacitor, difficulty in planarization and a shorten between top and bottom electrodes.

In accordance with one aspect of the present invention, there is provided a ferroelectric memory device divided into a first area including a plurality of ferroelectric capacitor and a second area not including the ferroelectric capacitor, including: a semiconductor substrate; a first insulating layer formed on the semiconductor substrate; a bottom electrode of the ferroelectric capacitor formed in the first insulating layer, wherein a top surface of the bottom electrode is planarized with the first insulating layer; a ferroelectric layer of the ferroelectric capacitor covering not only the bottom electrode but also all the first area; and a top electrode of the ferroelectric capacitor formed on the ferroelectric layer and overlapped with the bottom electrode.

In accordance with another aspect of the present invention, there is provided a method of forming a ferroelectric memory device divided into a first area including a plurality of ferroelectric capacitor and a second area not including the ferroelectric capacitor, comprising steps of: forming a bottom electrode of the ferroelectric capacitor on a substrate; forming a first insulating layer on the bottom electrode and the substrate; removing the first insulating layer until a top surface of the bottom electrode is exposed, wherein the bottom electrode disposed in the first insulating layer and the top surface of the bottom electrode is planarized with the first insulating layer; forming a ferroelectric layer covering not only the bottom electrode but also all the first area; and forming a top electrode of the ferroelectric capacitor on the terroelectric layer overlapped with the bottom electrode.

In accordance with further another aspect of the present invention, there is provided a method of forming a ferroelectric memory device divided into a first area including a plurality of ferroelectric capacitor and a second area not including the ferroelectric capacitor, comprising steps of: forming a first insulating layer on a substrate; forming an opening in the first insulating layer by selectively etching the first insulating layer; forming a bottom electrode of the ferroelectric capacitor in the opening, wherein a top surface of the bottom electrode is planarized with the first insulating layer; forming a ferroelectric layer of the ferroelectric capacitor covering not only the bottom electrode but also all the first area; and forming a top electrode of the ferroelectric capacitor on the ferroelectric layer.

BRIEF DESCRIPTION OF THE DRAWINGS

Other objects and aspects of the invention will become apparent from the following description of the embodiments with reference to the accompanying drawings, in which:

FIGS. 6A to 6D are cross-sectional views showing a manufacturing method of FeRAM shown in FIGS. 5A and 5B;

DETAILED DESCRIPTION OF THE INVENTION

Figure 1:
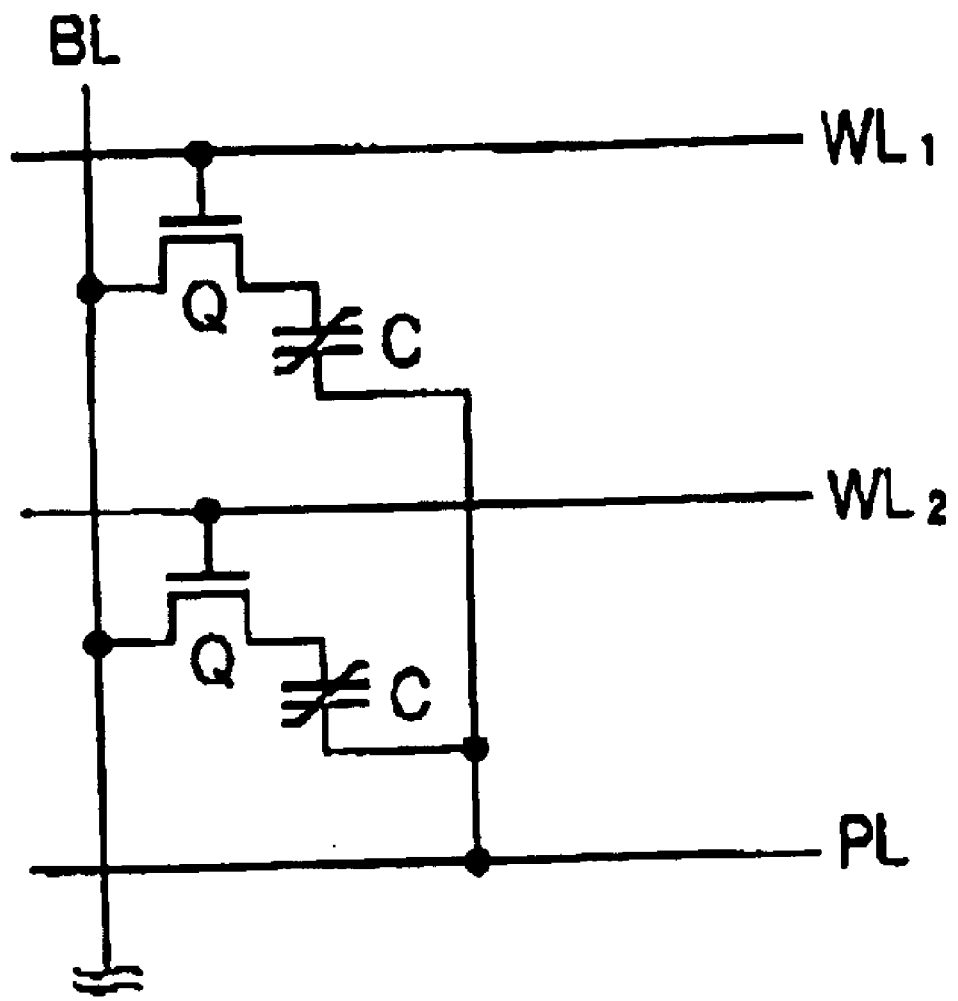
FIG. 1 is a conventional equivalent circuit illustrating a FeRAM having a 1T-1C structure.
Figure 2:
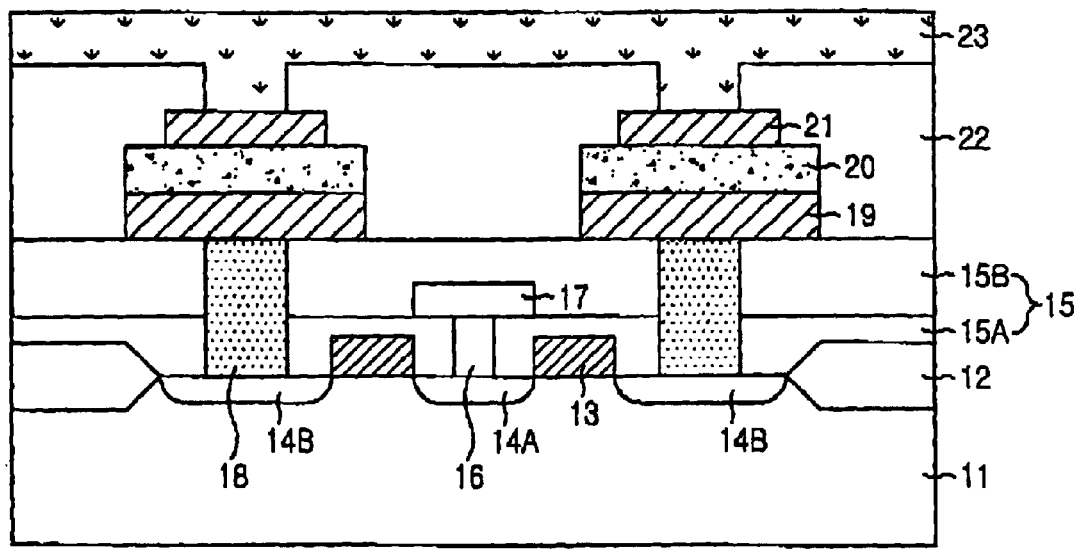
FIG. 2 is a cross-sectional view showing a conventional FeRAM.
Figure 3:
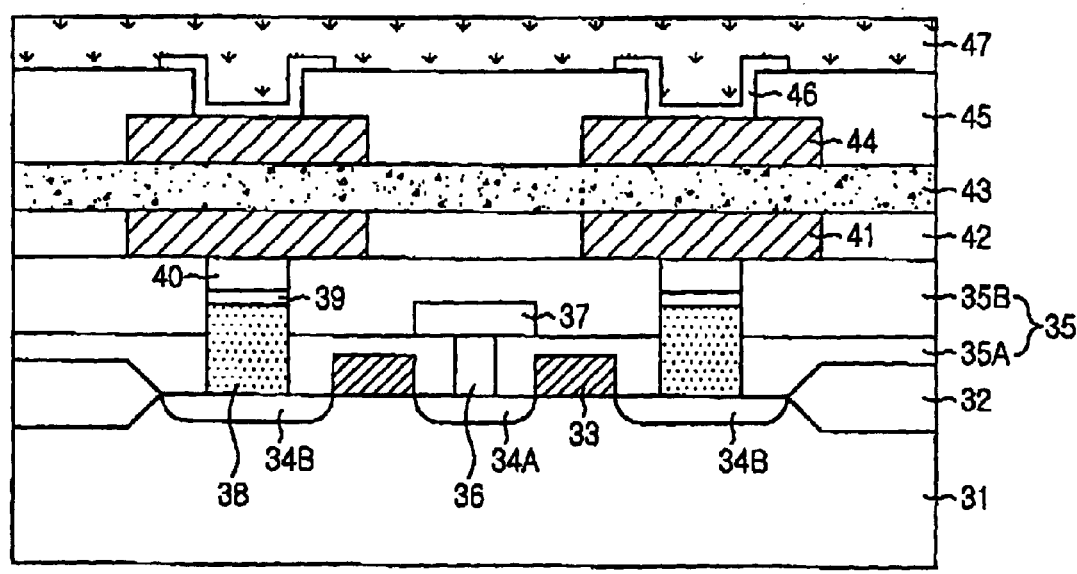
FIG. 3 is a cross-sectional view showing a FeRAM in accordance with a first embodiment of the present invention.

FIG. 3 is a cross-sectional view showing a FeRAM in accordance with a first embodiment of the present invention. The FeRAM shown in FIG. 3 has a structure that top electrodes of two capacitors are commonly connected to one plate line.

Referring to FIG. 3, a FeRAM includes, two adjacent transistors, a first interlayer insulating layer 35, a bit line, a second interlayer insulating layer 42, a ferroelectric capacitor, a third interlayer insulating layer 45 and a plate line 47, on a semiconductor substrate 31.

Each transistor includes a word line 33 formed on the semiconductor substrate 31, a common drain 34A to which the bit line 37 is coupled, and a source 34B.

The first interlayer insulating layer is formed of a first and second insulating layer 35A, 35B. A tungsten plug 36 is connected to the common drain 34a through a contact hole formed in the first insulating layer 35A, and a bit line 37 is formed on the first insulating layer 35A and the tungsten plug 36, 50 that the bit line 37 is coupled to the common drain 34A via the tungsten plug 36. A polysilicon plug 38, a titanium silicide layer 39 and a titanium nitride layer 40 are stacked in a contact hole formed in the first inter layer insulating layer 35 to expose the source 34B. The polysilicon plug 38 or tungsten plug 38 is a contact plug for coupling a bottom electrode of the ferroelectric capacitor to the transistor, the titanium silicide layer 39 is an ohmic contact layer, and the titanium nitride layer 40 is a diffusion barrier.

The ferroelectric capacitor includes a bottom electrode 41, a ferroelectric layer 43 and a top electrode 44. The bottom electrode 41 is formed in an opening defined in the second interlayer insulating layer 42. The ferroelectric layer 43 is formed on the second interlayer insulating layer 42 and the bottom electrode 41. Also, the ferroelectric layer covers all an area in which a plurality of ferroelectric capacitor is formed like cell area. The top electrode 44 is formed on the ferroelectric layer 43 to be overlapped with the bottom electrode 41 and to have the same size as the bottom electrode 41. The ferroelectric layer 43 is formed of $SrBi_2Ta_2O_9$ (SBT), $Bi_{4-x}La_xTi_3O_{12}$ (BLT), Pb $(Zr_x, Ti_{1-x})O_3$ (PZT), doped-SBT, doped-BLT, doped-PZT or other ferroelectric layer having perovskite or layered perovskite structure. The bottom and the top electrodes 41, 44 are formed of material selected from the group consisting of platinum, iridium, iridium oxide, ruthenium, ruthenium oxide, rhenium, rhodium and combinations thereof.

The third interlayer insulating layer 45 covers the ferroelectric capacitor and has a contact hole exposing the top electrode 44 of the ferroelectric capacitor therein. The plate line 47 is coupled to the top electrode 44 through a diffusion barrier layer 46 formed in the contact hole and connected to the top electrode 44.

In the preferred embodiment of the present invention, the first to third interlayer insulating layer are formed of material selected from a group consisting of oxide, nitride and combination thereof. Specially, the second interlayer insulating layer 42 is formed of material selected from a group consisting of tetraethyl orthosilicate(TEOS), phospho silicate glass(PSG), borophospho silicate glass{BPSO}, silicon nitride and combinations thereof.

The manufacturing method of forming the FeRAM shown in FIG. 3 will be described with reference to FIGS. 4A to 4D.

Figure 4A:
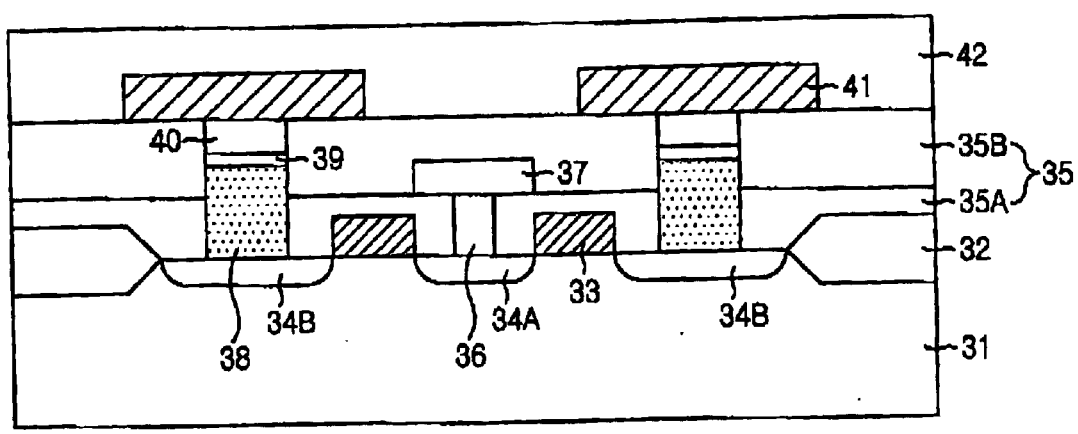
FIGS. 4A to 4D are cross-sectional views showing manufacturing method of FeRAM shown in FIG. 3.

Referring to FIG. 4A, a device isolation 32 and a plurality of word line 33 are formed on the a semiconductor substrate 31, and source/drain 34A, 34B of a transistor are formed by implanting ions into the semiconductor substrate 31 at both sides of the word line 33.

One of the source/drain becomes a common junction region, i.e. common drain, to which a bit line will be coupled. Therefore, the other of the source/drain becomes source of each transistor.

A first interlayer insulating layer 35A is formed to cover the semiconductor substrate 31 and is flattened. Thereafter, the first insulating layer 35A is etched to form a first contact hole exposing the common drain 34A, and a tungsten plug 36 is formed in the first contact hole.

A first conductive layer is formed on the first insulating layer 35A and is patterned to form the bit line 37 coupled to the common drain 34B through the tungsten plug 36.

A second insulating layer 35B is formed on the first insulating layer 35A and the bit line 37, and the second and first insulating layer 35B, 35A are etched to form second contact hole exposing the source of the transistor, after flattening the second insulating layer 35B.

Each the first and second interlayer insulating layer 35A, 35B forms the first interlayer insulating layer 35.

A polysilicon layer is formed on a surface of the second insulating layer 35B and the second contact hole, and an etch back process is applied to the polysilicon layer to form a polysilicon plug 38 in the second contact hole. Thereafter, a titanium silicide layer 39 is formed on the polysilicon plug 38. At this time, a titanium layer is deposited and is undergone an annealing to form the titanium silicide layer 39, and remaining portions of titanium layer which are not changed to the titanium silicide are removed by an etch process.

A barrier layer 40 is formed on the titanium silicide layer 39 in the second insulating layer 35B, by depositing a is layer selected from a group consisting of TiN, TiAlN, TiSiN, RuTiN, CrTiN, and combination layers thereof, on the resulting structure including the titanium silicide 39, and by selectively removing the layer on the second insulating 35B with an etch back or a chemical mechanical polishing (CMP). The barrier layer 40 can be formed on the second insulating layer 35B in order that the barrier layer should have the same width with a bottom electrode of the capacitor to be formed thereon.

The stacked layer of poly silicon plug 38, the titanium silicide 39 and the barrier layer 40 forms a storage node contact.

A bottom electrode 41 is formed on the barrier layer 40 and the second insulating layer 35B by depositing and patterning a second conductive layer. The bottom electrode 41 is formed by depositing material selected from a group consisting of platinum, iridium, iridium oxide, ruthenium, rhenium, rhodium, and combinations thereof with chemical vapor deposition(CVD) or atomic layer deposition layer (ALD). Also, the bottom electrode 41 can be formed of a stack layer like $Ir/IrO_x/Pt$.

A third insulating layer 42 is formed on the bottom electrode 41 and the second insulating layer 35B with material selected from a group consisting of silicon oxide like tetra ethyl ortho silicate(TEOS), phospho silicate glass (PSG), and borophospho silicate glass {BPSG}, silicon nitride and combinations thereof.

Figure 4B:
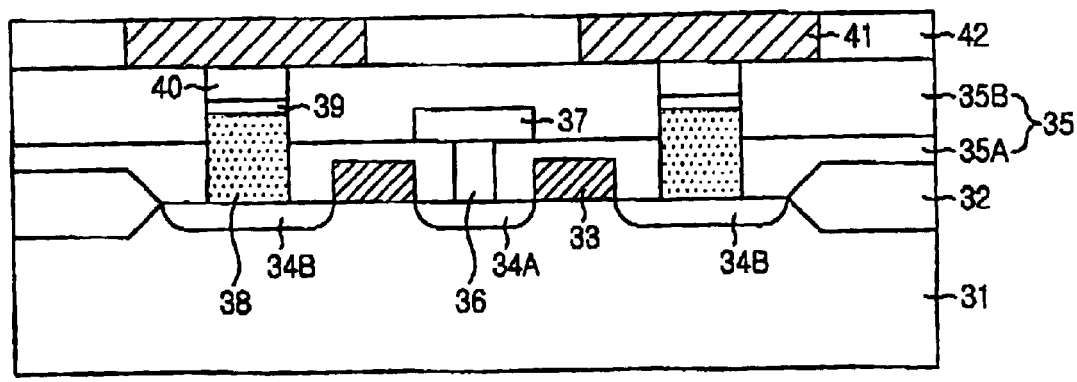

Referring to FIG. 4B, the third insulating layer 42 is selectively removed by an etch back or a CMP until the surface of the bottom electrode 41 is exposed.

Figure 4C:
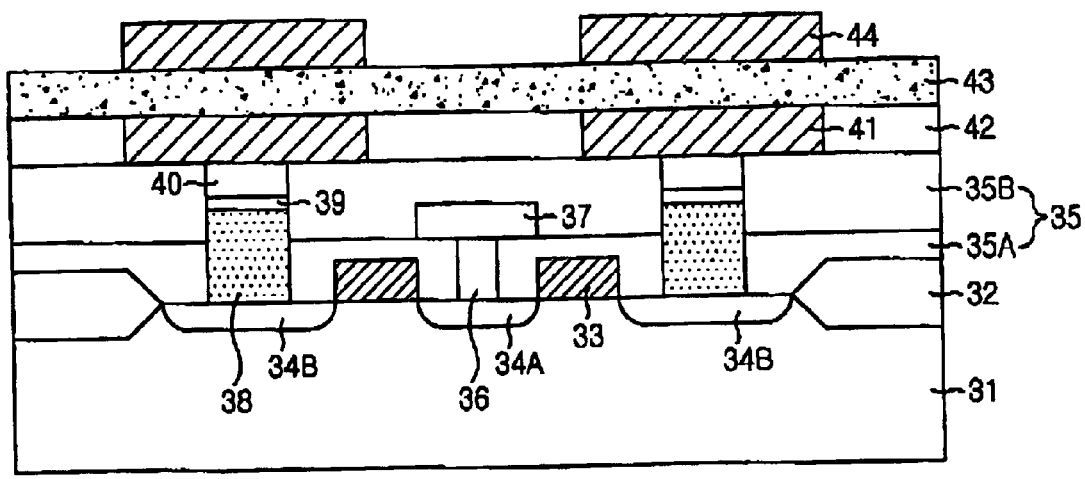

Referring to FIG. 4C, a ferroelectric layer 43 is formed on the third interlayer insulating layer 42 and the bottom electrode 41. On the ferroelectric layer 43, a top electrode, of which size is not smaller than that of the bottom electrode 41, is formed by depositing and patterning a third conductive layer. The ferroelectric layer 43 is formed of material selected from a group consisting of $SrBi_2Ta_2O_9$ (SBT), $Bi_{4-x}La_xTi_3O_{12}$ (BLT), Pb $(Zr_x, Ti_{1-x})O_3$ (PZT), doped-SBT, doped-BLT, doped-PZT or other ferroelectric layer having perovskite or layered perovskite structure with a CVD, a spin coating or liquid source misted chemical deposition(LSMCD). The top electrode 44 is formed by depositing material selected from a group consisting of platinum, iridium, iridium oxide, ruthenium, rhenium, rhodium, and combinations thereof with physical vapor deposition (PVD), chemical vapor deposition(CVD) or atomic layer deposition layer(ALD).

As mentioned above and shown in FIG. 4C, the top electrode 44 is fully isolated from the bottom electrode 41 by the ferroelectric layer 43, the size of the top electrode 44 is not limited to smaller size of the bottom electrode 41. Also, the same mask can be used to form the top and bottom electrode because the bottom electrode can be formed to the same size with the top electrode.

Figure 4D:
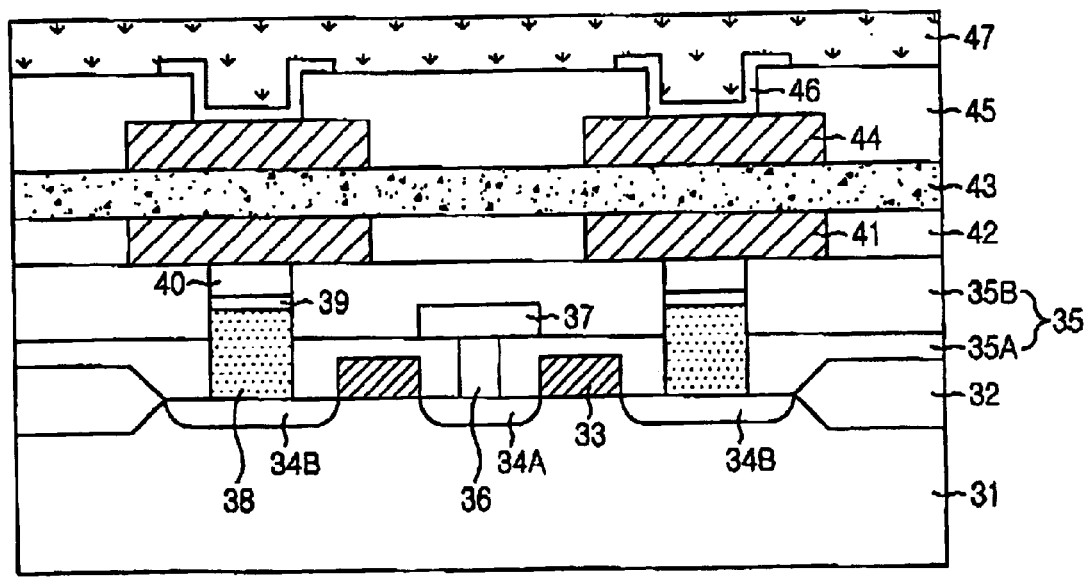

Referring to FIG. 4D, a fourth interlayer insulating part 45 is formed on the top electrode 44 and the ferroelectric layer 43, and the fourth interlayer insulating part 45 is selectively etched to form a capacitor contact hole exposing a portion of the top electrode 44.

Thereafter, a diffusion barrier 46 is formed in the capacitor contact hole by deposing and patterning a layer selected from a group consisting of TiN layer, Ti layer or a Ti/TiN layer.

After forming the diffusion barrier 46, a metal layer is formed on the diffusion barrier 46 and the fourth interlayer insulating layer, and is patterned to form a plate line 47 coupling adjacent top electrodes 44.

In the first embodiment of the present invention, the bottom electrode 41 is formed before forming the third interlayer insulating layer 42, however, the bottom electrode 41 can be formed in a bottom electrode region defined within the third interlayer insulating layer 42 after forming and selectively etching the third interlayer insulating layer 42 to form the bottom electrode region.

Figure 5A:
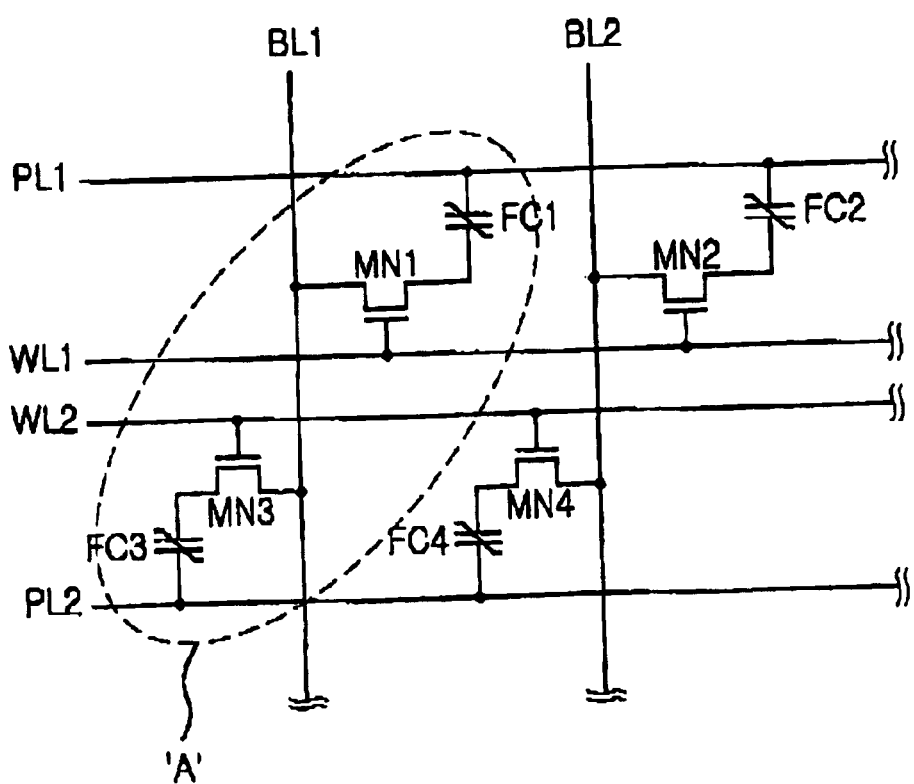
FIG. 5A is an equivalent circuit showing a FeRAM in accordance with a second embodiment of the present invention.
Figure 5B:
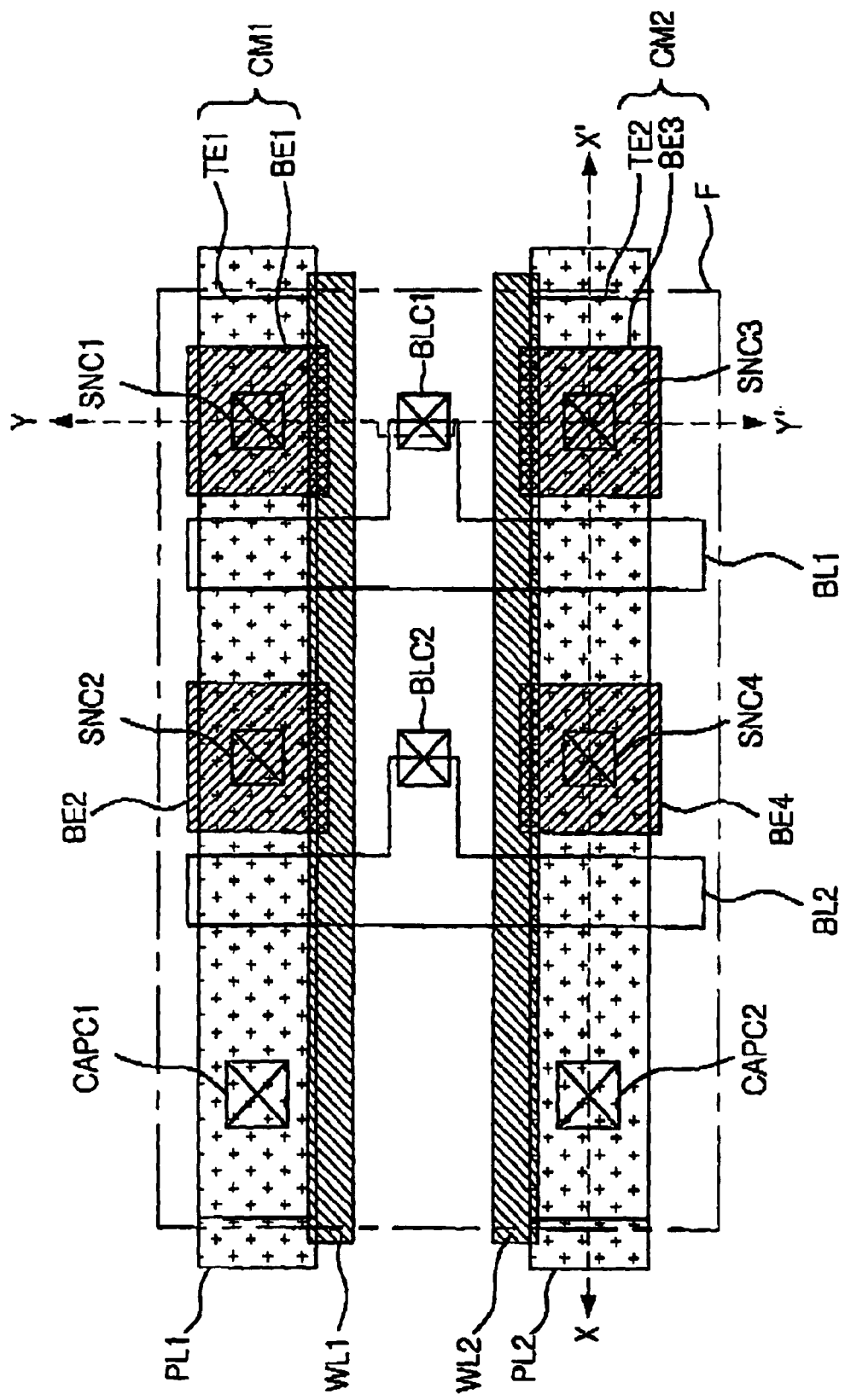
FIG. 5B is a layout for embodying the FeRAM shown in FIG. 5A.
Figure 6A:
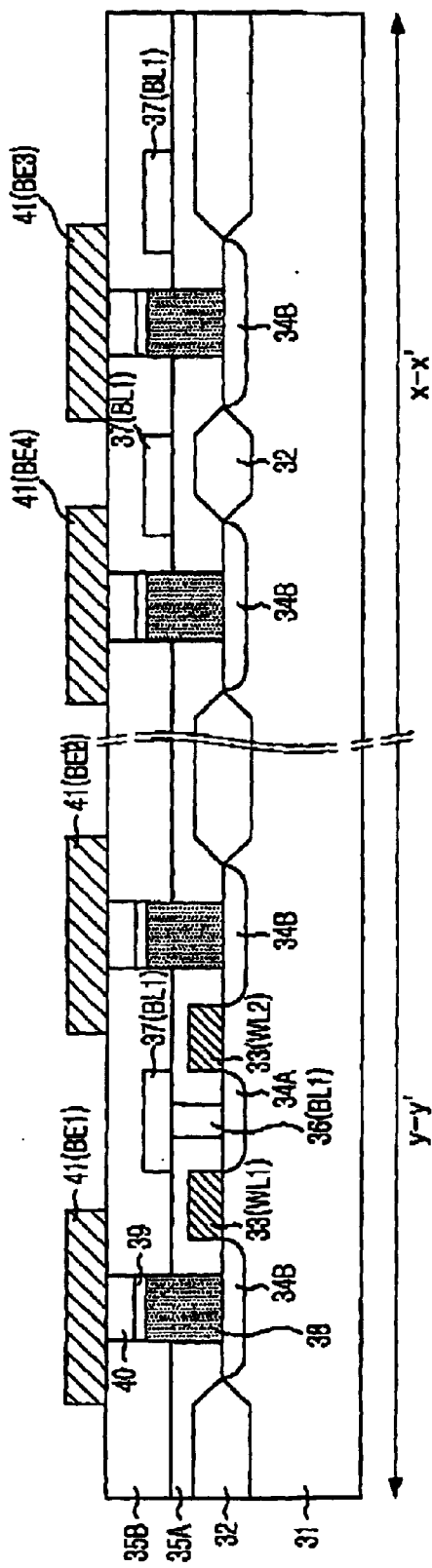
Figure 6B:
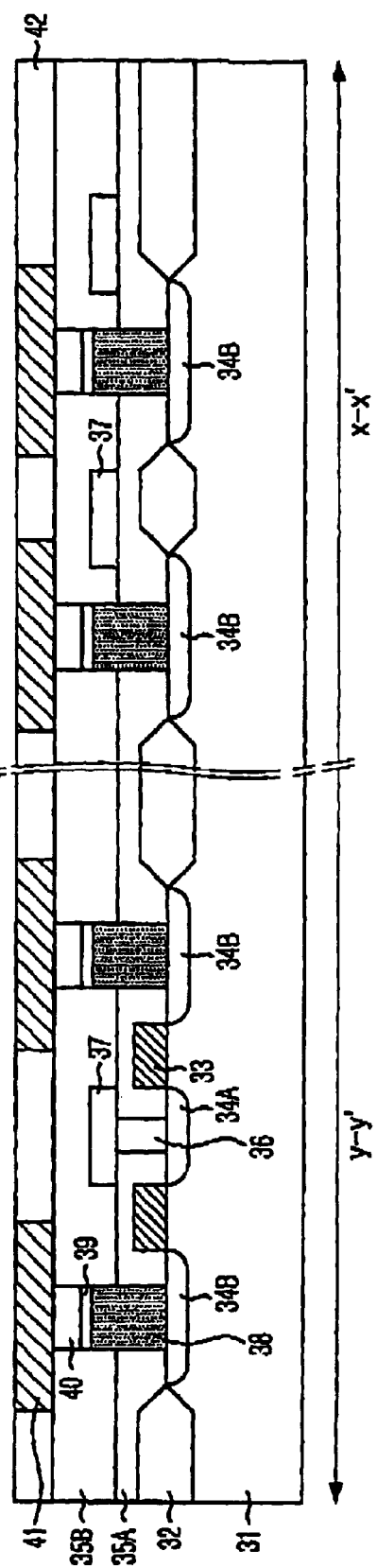
Figure 6C:
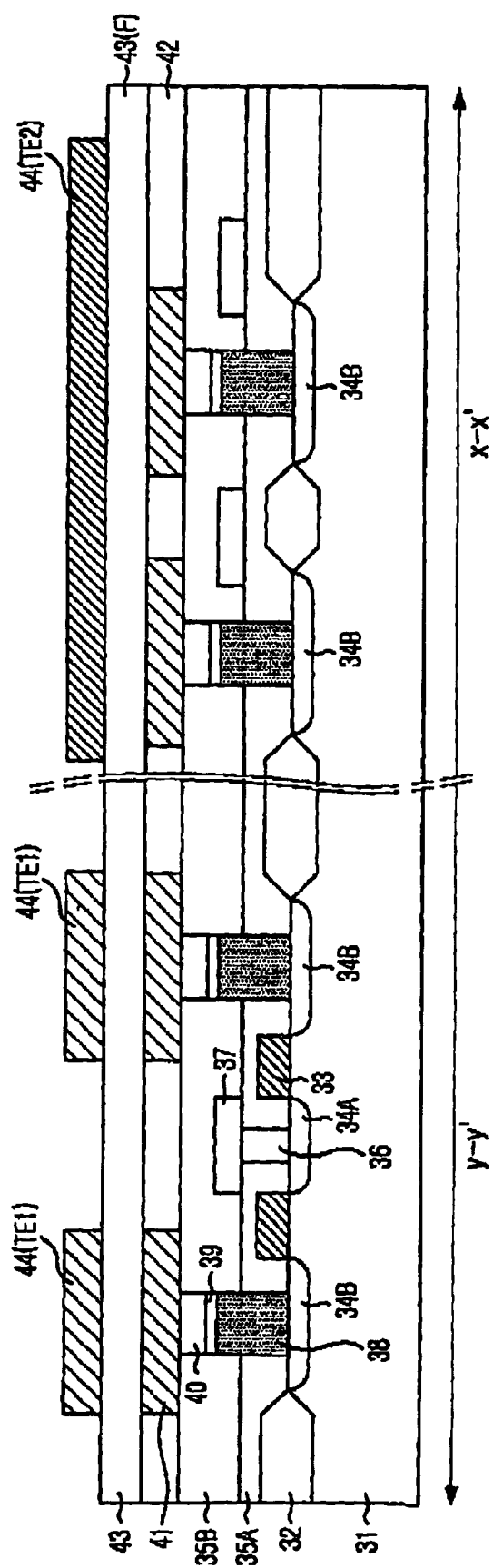

FIG. 5A is an equivalent circuit showing a FeRAM in accordance with a second embodiment of the present invention, and FIG. 5B is a layout for embodying the FeRAM shown in FIG. 5A. In FIGS. 5A and 5B, WL1 and WL2 denote word line, BL1 and BL2 denote bit line, BLC1 and BLC3 denote bit line contact, PL1 and PL2 denote plate line, NM1 to NM4 denote NMOS transistor, and FC1 to FC4 denote ferroelectric capacitor.

Referring to FIG. 5A, as shown in 'A', memory cells commonly coupled to the same bit line BL1 share the same plate line PL2. Each memory cell, in the same row, has a ferroelectric capacitor including one electrode coupled to the same plate line and a NMOS transistor including a gate coupled to the same word line, a drain coupled to bit line different from the adjacent memory cell in the same row and a source coupled to another electrode of the ferroelectric capacitor.

Referring to FIG. 5B, the word lines WL1, WL2 and the bit lines BL1, BL2 are arranged to cross each other. For instance, the word lines, WL1, WL2 are arranged to Y-axis and the bit lines BL1, BL2 are arranged to X-axis. Bit line contacts BLC1, BLC2 are arranged between the world lines WL1, WL2 for coupling the bit lines to a semiconductor substrate. A first and a second capacitor module CM1, CM2 are arranged parallel to world line WL1, WL2, respectively, The capacitor modules CM1, CM2 are arranged at one side of each word line WL1, WL2, and the bit line contacts BLC1 and BLC2 are arranged the other side of each word line WL1, WL2 in order that the bit line contact and the capacitor module should not be connected to each other.

The first capacitor module CM1 includes storage nodes contact SNC1, SNC2, bottom electrodes BE1, BE2, contacted to the storage node contact SNC1, SNC2, a top electrode TE1, a plate line PL1 and a capacitor contact CAPC1 formed on one end of the plate line PL1 for coupling the top electrode TE1 and the plate line PL1.

The second capacitor module CM2 includes storage nodes contact SNC3, SNC4, bottom electrodes BE3, BE4, contacted to the storage node contact SNC3, SNC4, a top electrode TE2, a plate line PL2 and a capacitor contact CAPC2 formed on one end of the plate line PL2 for coupling the top electrode TE2 and the plate line PL2.

Also, each first and second capacitor module CM1, CM2 includes a ferroelectric layer F in common. Each top electrode TE1, TE2 can be plate line PL1, PL2 it self, that is, in case of this, the plate line PL1, PL2 can be omitted.

FIGS. 6A to 6D are cross-sectional views showing a manufacturing method according to lines X–X' and Y–Y' of FIG. 5B.

In FIGS. 6A to 6D, it should be understood that similar reference numerals corresponds to similar elements for FIGS. 4A to 4D. The differences between the first and second embodiment of the present invention are the same as follows.

Two adjacent capacitors along the direction of the world line are isolated by a field oxide 22, as shown in parts of FIGS. 6A to 6D according to line X–X' of FIG. 5B. Namely, the two adjacent capacitors are not formed on the same active region.

Also, a capacitor contact hole exposing an end of the top electrode 44 is formed in the third insulating part 45 for the capacitor contact CAPC2 as shown in FIG. 6D. Therefore, it is possible to form a large capacitor contact even if cell area is reduced because the capacitor contact is not formed on each capacitor but is formed on an end of the top electrode.

Furthermore, the process for forming a diffusion barrier 46 for preventing titanium elements from diffusing to a ferroelectric layer 43 can be omitted because the capacitor contact is formed on an end of the top electrode so that titanium elements diffused from the plate line do not affect on the characteristic of the ferroelectric layer 43. In case of forming the diffusion barrier layer 46, the surface of the third insulating part 45 is changed during an etch process for forming a pattern of the diffusion barrier layer 46, therefore, some problems are generated, and it is difficult to form a contact hole exposing a bit line in a peripheral region to a predetermined shape by a wet etch process. However, in case of omitting the process of forming the diffusion barrier, it is possible to form the contact hole to a wine glass shape by a wet etching. Accordingly, a conductive layer is filled well in the contact hole and contact resistance is reduced.

Figure 7:
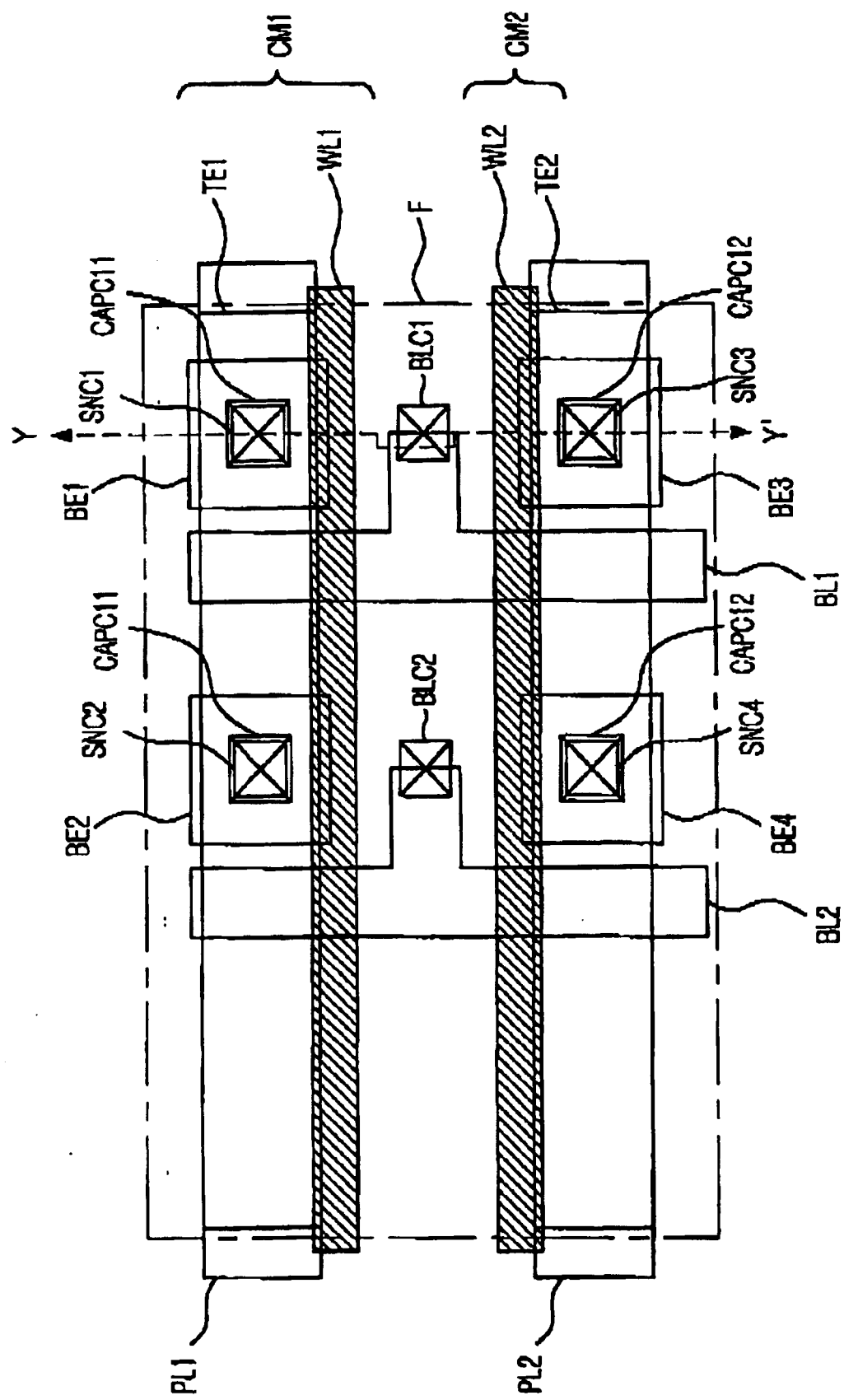
FIG. 7 is a layout in accordance with a third embodiment of the present invention.
Figure 8A:
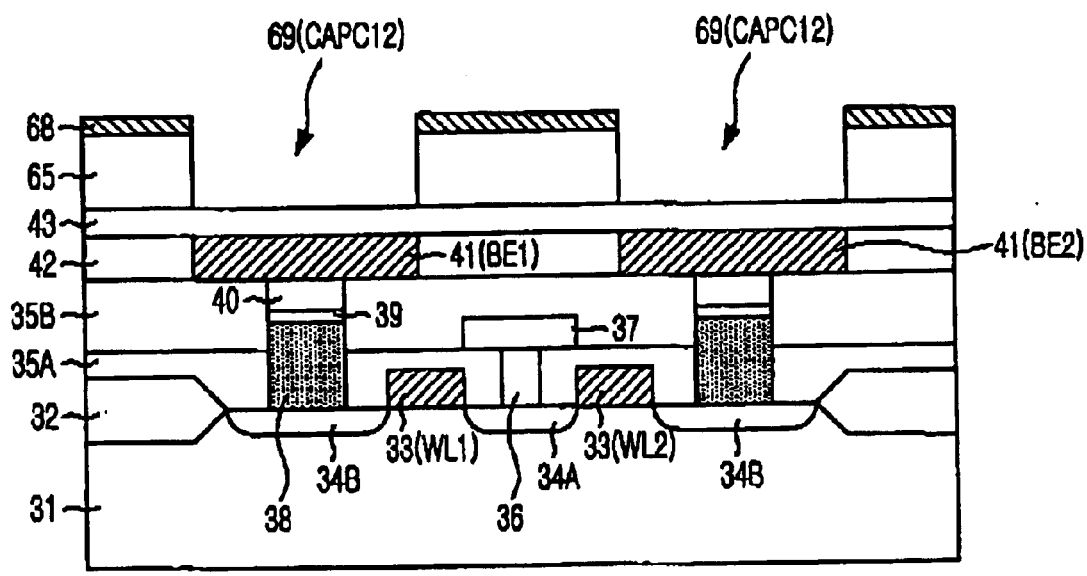
FIGS. 8A and 8B are cross-sectional views showing a manufacturing method of FeRAM shown in FIG. 7.
Figure 8B:
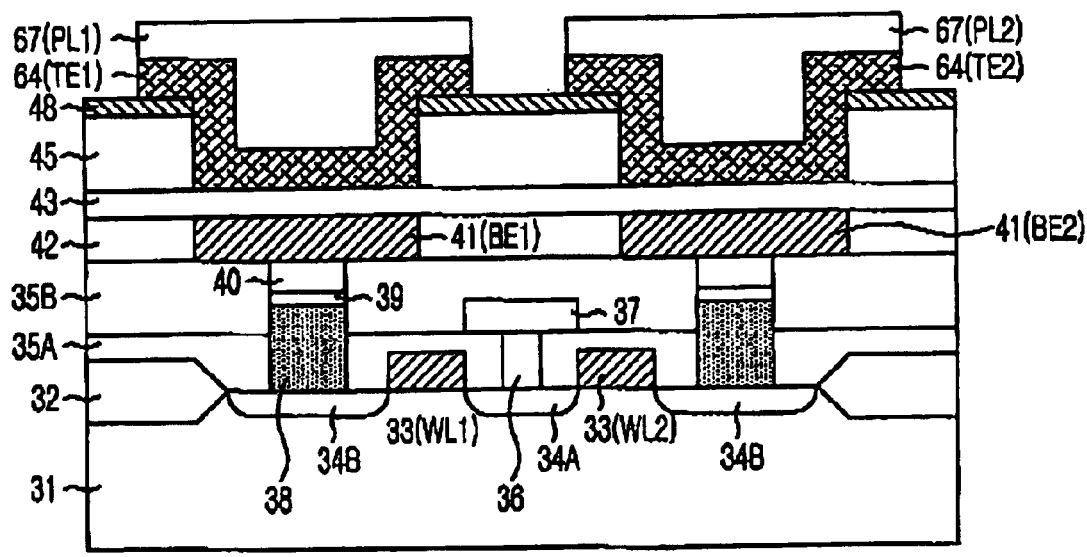

FIG. 7 is a layout of a FeRAM according to a third embodiment of the present invention, and FIGS. 8A and 8B are cross-sectional views showing a manufacturing method according to a line Y–Y' of FIG. 7.

In FIG. 7, it should be understood that similar reference numerals corresponds to similar elements for FIG. 5B. The differences between the second and third embodiment of the present invention are the same as follow.

Capacitor contact for coupling a top electrode and a plate line is arranged on each ferroelectric capacitor. In FIG. 7, CAPC11 and CAPC12 denote capacitor contacts on each capacitor module, CM1 and CM2.

The method of forming the FeRAM in accordance with the third embodiment is shown in FIGS. 8A and 8B. In FIGS. 8A and 8B, it should be understood that similar reference numerals corresponds to similar elements for FIGS. 4A to 4D.

Referring to FIG. 8A, an interlayer insulating layer 65 and an adhesion layer 68 are formed on a ferroelectric layer 43. The adhesion layer 68 is formed of $TiO_2$ or $Al_2O_3$.

A contact hole 69 exposing the ferroelectric layer 43 is formed by selectively etching the adhesion layer 68 and the interlayer insulating layer 65. At this time, a wet etch is adopted to the adhesion layer 68 and the interlayer insulating layer in order that the ferroelectric layer 43 is not deteriorated due to plasma.

Referring to FIG. 8B, conductive layers are formed on a resulting structure including the contact hole 69, and the conductive layer are patterned to form a top electrode 64 and a plate line 67 through one etch process. At this time, the top electrode is formed to a size not smaller than that of a bottom electrode 61, and the plate line 67 is formed of a TiN/Ti/Al/TiN stack layer.

Figure 9:
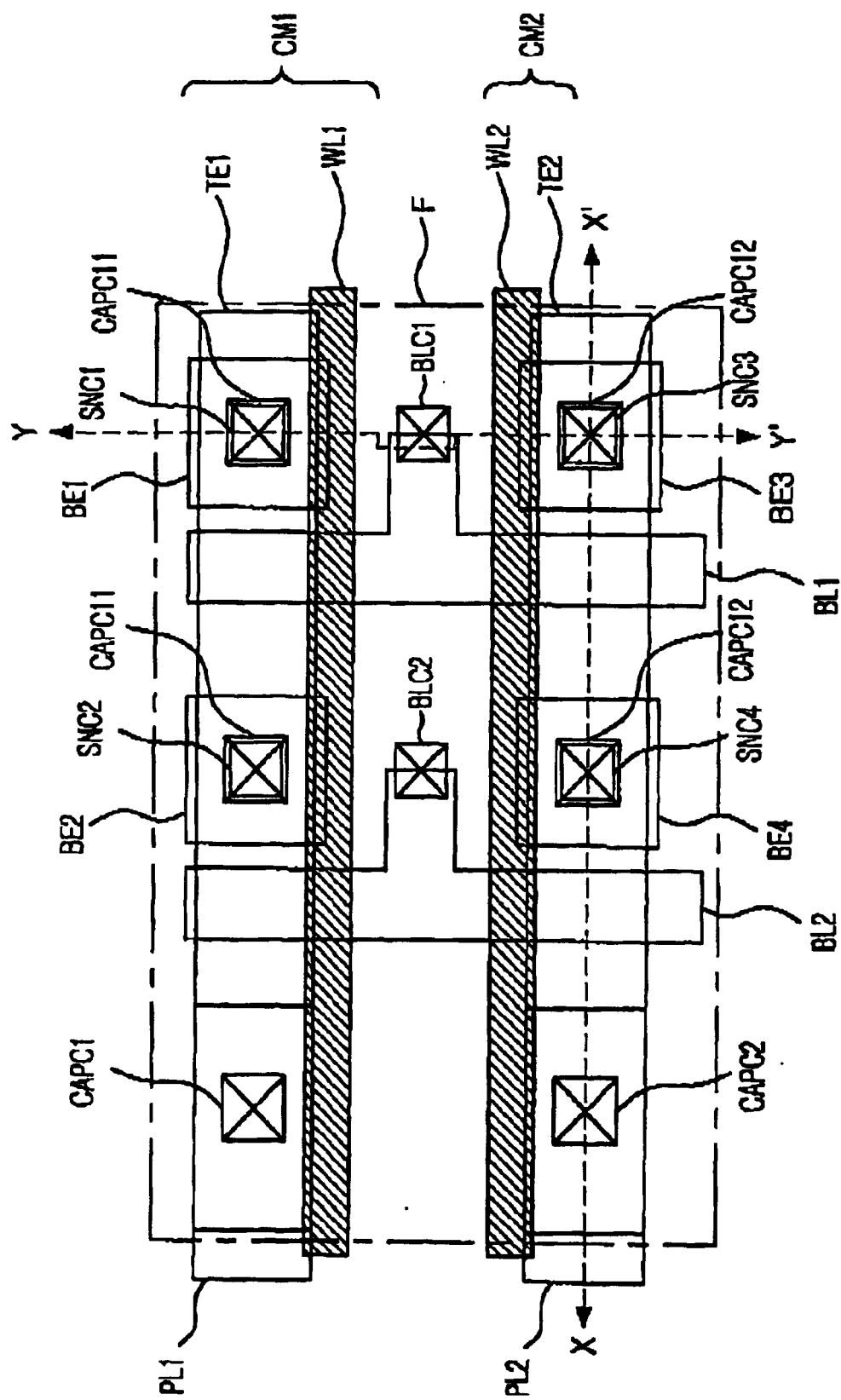
FIG. 9 is a layout diagram in accordance with a fourth embodiment of the present invention.
Figure 10A:
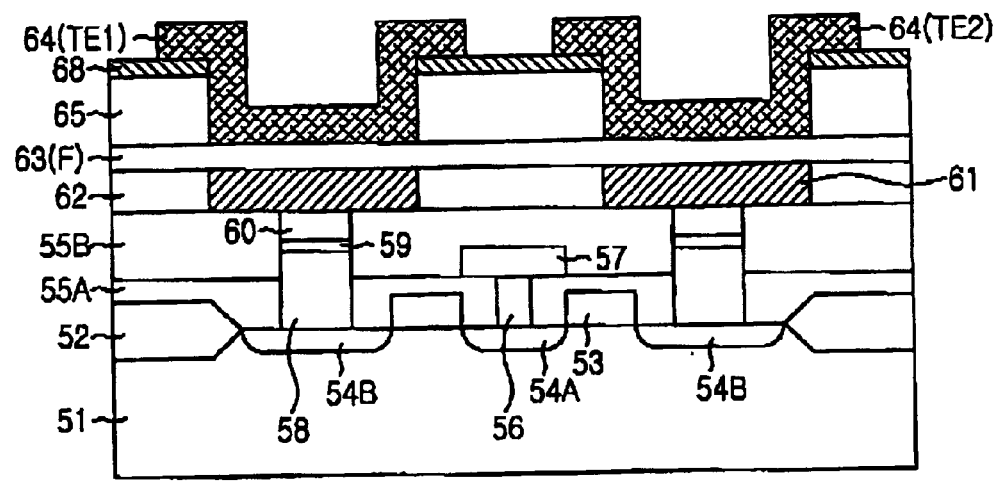
FIGS. 10A and 10B are cross-sectional view according to a Y–Y' line and X–X' line in FIG. 9.
Figure 10B:
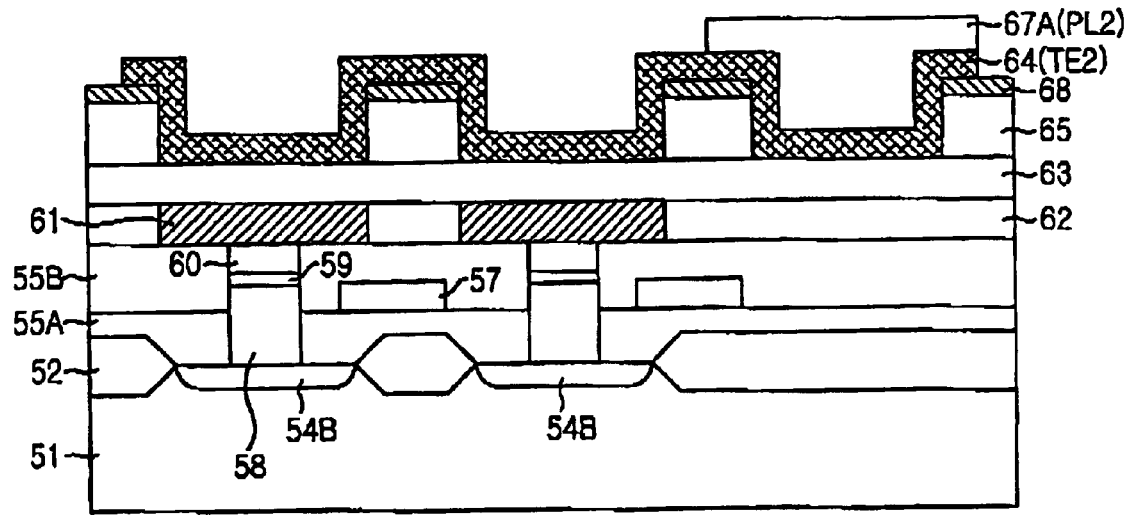

FIG. 9 is a layout of a FeRAM according to a fourth embodiment of the present invention, and FIGS. 10A and 10B are cross-sectional views showing a manufacturing method according to lines Y–Y' and X–X' of FIG. 9, respectively.

In FIG. 9, it should be understood that similar reference numerals corresponds to similar elements for FIGS. 5B and 7. The third embodiment of the present invention is different from the third embodiment in that capacitor contacts CPAC11, CAPC12, CAPC1, CAPC2 are arranged not only on each ferroelectric capacitor but also on an end of each top electrode, as shown in FIG. 9, and plate lines are coupled to the top electrode through only the capacitor contact arranged on the ends of the top electrode as shown in FIG. 10B.

The method of forming the FeRAM in accordance with the fourth embodiment is shown in FIGS. 10A and 10B. In FIGS. 10A and 10B, it should be understood that similar reference numerals corresponds to similar elements for FIGS. 8A and 8B.

Referring to FIG. 10A, a top electrode 64 is formed in a contact hole within an adhesion layer 68 and an interlayer insulating layer 65 and on a ferroelectric layer 43 to a size not smaller than a bottom electrode 61.

Referring to FIG. 10B, a conductive layer is formed on a resulting structure including the top electrode 64 and is patterned to form the plate line 67 on each end of the top electrode.

Figure 11:
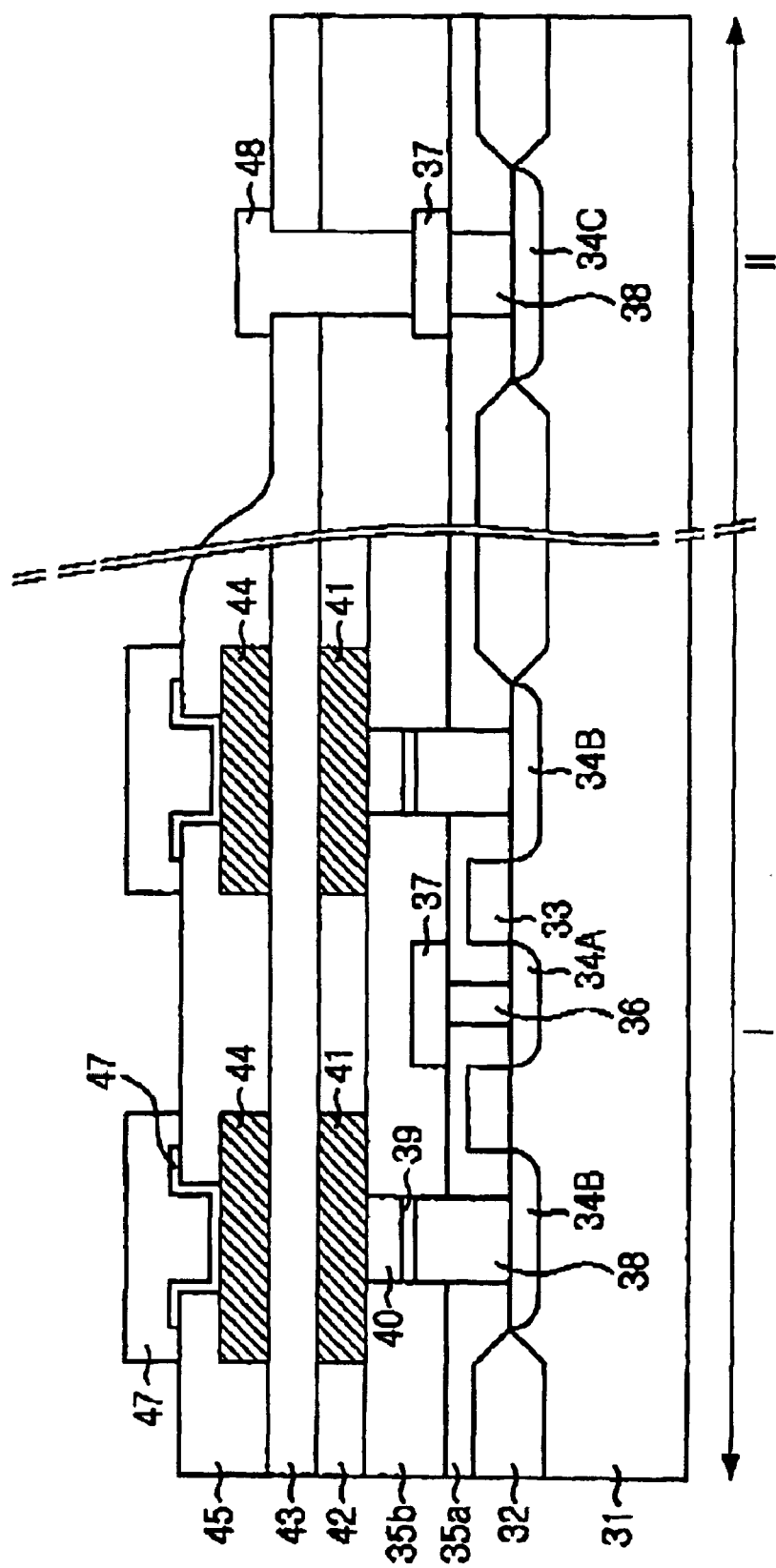
FIG. 11 is a cross sectional view of FeRAM including a ferroelectric layer only in a cell area in accordance with the present invention.

FIG. 11 is a cross sectional view of FeRAM including a ferroelectric layer only in a cell area I in accordance with the present invention. As shown in FIG. 11, a ferroelectric layer 43 is not formed on a peripheral circuit area II.

The ferroelectric layer in cell region FeRAM in accordance with the present invention, therefore, it is possible to prevent the ferroelectric layer being deteriorated from plasma, and to form the top electrode larger than the bottom electrode. Also, the burden of etch process adopted to form the ferroelectric capacitor is reduces owing to the step height of a target layer is reduced. Furthermore, in case of forming the capacitor contact only on an end of the top electrode, the possibility of the contact between the plate line and the bottom electrode, and the difficulty of forming the capacitor contact can be reduced even if the cell size is decreased.

What is claimed is:

1. A method of forming a ferroelectric memory device divided into a first area including a plurality of ferroelectric capacitor and a second area not including the ferroelectric capacitor, comprising steps of:

forming a bottom electrode of the ferroelectric capacitor on a substrate;

forming a first insulating layer on the bottom electrode and the substrate;

removing the first insulating layer until a top surface of the bottom electrode is exposed, wherein the bottom electrode disposed in the first insulating layer and the top surface of the bottom electrode is planarized with the first insulating layer;

forming a ferroelectric layer of the ferroelectric capacitor covering not only the bottom electrode but also all the first area; and forming a top electrode of the ferroelectric capacitor on the ferroelectric layer overlapped with the bottom electrode.

2. The method of claim 1 further comprising steps of:
   forming a second insulating layer covering the top electrode;

forming a first contact hole exposing the top electrode by selectively etching the second including layer; and forming a plate line coupling to the top electrode through the first contact hole.

3. The method of claim 2, wherein the top electrode is formed to be shared by adjacent ferroelectric capacitors, a second contact hole exposing an end of the top electrode is formed with the first contact hole in the second insulating layer, and the plate line is formed to be coupled to the top electrode through the first and the second contact hole.

4. The method of claim 1, wherein the top electrode is shared by adjacent ferroelectric capacitors, and the method further comprises the steps of:

forming a third insulating layer covering the top electrode;

forming a third contact hole exposing an end of the top electrode by selectively etching the third insulating layer; and forming a plate line coupling to the top electrode through the third contact hole.

5. The method of claim 1 further comprising steps of:
   forming a fourth insulating layer and an adhesion layer on the ferroelectric layer;

forming an opening exposing the ferroelectric layer by applying a wet etch process to the adhesion layer and the fourth insulating layer;

forming a top electrode in the opening; and forming a plate line on an end the top electrode.

6. A method of forming a ferroelectric memory device divided into a first area including a plurality of ferroelectric capacitor and a second area not including the ferroelectric capacitor, comprising steps of:

forming a first insulating layer on a substrate;

a forming a first opening in the first insulating layer by selectively etching the first insulating layer;

forming a bottom electrode of the ferroelectric capacitor in the first opening, wherein a top surface of the bottom electrode is planarized with the first insulating layer;

forming a ferroelectric layer of the ferroelectric capacitor covering not only the bottom electrode but also all the first area; and forming a top electrode of the ferroelectric capacitor on the ferroelectric layer.

7. The method of claim 6 further comprising steps of:
   forming a second insulating layer covering the top electrode;

forming a first contact hole exposing the top electrode by selectively etching the second including layer; and forming a plate line coupled to the top electrode through the first contact hole.

8. The method of claim 6, wherein the top electrode is formed to being shared by adjacent ferroelectric capacitors, a second contact hole exposing an end of the top electrode is formed with the first contact hole in the second insulating layer, and the plate line is formed to be coupled to the top electrode through the first and the second contact hole.

9. The method of claim 6, wherein the top electrode is shared by adjacent ferroelectric capacitors, and the method further comprises steps of:

forming a third insulating layer covering the top electrode;

forming a third contact hole exposing an end of the top electrode by selectively etching the third insulating layer; and forming a plate line coupling to the top electrode through the third contact hole.

10. The method of claim 6 further comprising steps of:

forming a fourth insulating layer and an adhesion layer on the ferroelectric layer;

forming a second opening exposing the ferroelectric layer by applying a wet etch process to the adhesion layer and the fourth insulating layer;

forming the top electrode in the second opening; and forming a plate line on an end of the top electrode.

* * * * *